United States Patent
Russell et al.

(10) Patent No.: US 9,123,715 B2
(45) Date of Patent: Sep. 1, 2015

(54) METHOD OF SEALING A GLASS ENVELOPE

(75) Inventors: Andrew Lawrence Russell, Elmira, NY (US); Lu Zhang, Painted Post, NY (US); Yabei Gu, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 1769 days.

(21) Appl. No.: 12/393,538

(22) Filed: Feb. 26, 2009

(65) Prior Publication Data

US 2009/0221207 A1 Sep. 3, 2009

Related U.S. Application Data

(60) Provisional application No. 61/067,409, filed on Feb. 28, 2008.

(51) Int. Cl.
*H01L 21/50* (2006.01)
*C03C 27/06* (2006.01)
*H01L 51/52* (2006.01)

(52) U.S. Cl.
CPC ........... *H01L 21/50* (2013.01); *C03C 27/06* (2013.01); *H01L 51/5246* (2013.01)

(58) Field of Classification Search
USPC .......................................................... 65/36
See application file for complete search history.

(56) References Cited

U.S. PATENT DOCUMENTS

| | | | |
|---|---|---|---|
| 6,416,375 B1 * | 7/2002 | Cho et al. ................ | 445/25 |
| 6,517,403 B1 * | 2/2003 | Cooper et al. ........... | 445/25 |
| 6,586,087 B2 * | 7/2003 | Young ...................... | 428/323 |
| 6,998,776 B2 | 2/2006 | Aitken et al. ............ | 313/512 |
| 7,602,121 B2 * | 10/2009 | Aitken et al. ............ | 313/512 |
| 2001/0038365 A1 | 11/2001 | Igeta | |
| 2003/0222061 A1 | 12/2003 | Langer et al. | |
| 2004/0206953 A1 * | 10/2004 | Morena et al. ........... | 257/40 |
| 2004/0207314 A1 | 10/2004 | Aitken et al. | |
| 2006/0082298 A1 | 4/2006 | Becken et al. ........... | 313/512 |
| 2006/0084348 A1 * | 4/2006 | Becken et al. ........... | 445/25 |
| 2007/0128967 A1 * | 6/2007 | Becken et al. ........... | 445/25 |
| 2007/0286973 A1 * | 12/2007 | Sawai et al. ............. | 428/34.4 |
| 2010/0129666 A1 * | 5/2010 | Logunov et al. ......... | 428/426 |

(Continued)

FOREIGN PATENT DOCUMENTS

| | | |
|---|---|---|
| JP | 2001-319775 | 11/2001 |
| JP | 2002-137939 | 5/2002 |

(Continued)

OTHER PUBLICATIONS

US Non-Final Office Action, U.S. Appl. No. 11/992,370, Applicant: Keith James Becken et al., Notification Date: Nov. 28, 2011.

(Continued)

*Primary Examiner* — Joseph S Del Sole
*Assistant Examiner* — Russell Kemmerle, III
(74) *Attorney, Agent, or Firm* — Kevin M. Able

(57) ABSTRACT

A method of hermetically sealing a glass assembly comprising glass plates or substrates with a glass-based frit when there is a large difference between the coefficient of thermal expansion (CTEs) of the frit and the CTEs of the glass plates. The method comprises a rapid increase of an irradiating heat source, used to heat and soften the frit, from a non-sealing power to a sealing power over a very short distance along the frit to form an initial stabilizing seal between the substrates.

16 Claims, 7 Drawing Sheets

(56) References Cited

U.S. PATENT DOCUMENTS

| | | |
|---|---|---|
| 2010/0304513 A1* | 12/2010 | Nguyen et al. .................. 438/27 |
| 2011/0135857 A1* | 6/2011 | Logunov et al. ............. 428/34.6 |
| 2011/0198986 A1* | 8/2011 | Kuromiya et al. ............ 313/484 |

FOREIGN PATENT DOCUMENTS

| | | | |
|---|---|---|---|
| JP | 2002-163977 | 6/2002 | |
| JP | 2003-332061 | 11/2003 | |
| WO | WO99/17329 * | 4/1999 | |
| WO | 2004/095597 | 11/2004 | |
| WO | WO2007/067384 | 6/2007 | .............. H01L 21/56 |

OTHER PUBLICATIONS

Response to US Non-Final Office Action, U.S. Appl. No. 11/992,370, Applicant: Keith James Becken et al., Receipt Date: Feb. 27, 2012.

* cited by examiner

METHOD OF SEALING A GLASS ENVELOPE

CROSS-REFERENCE TO RELATED APPLICATION

This application claims the benefit of priority under 35 U.S.C. §119(e) of U.S. Provisional Application Ser. No. 61/067,409 filed on Feb. 28, 2008.

BACKGROUND OF THE INVENTION

1. Field of the Invention

The present invention relates to methods for sealing together substrates having high coefficients of thermal expansion. More particularly, the present invention relates to a method for sealing together several glass sheets with a frit to form a glass package suitable for housing an electrical or electronic device, wherein a large difference in CTE exists between the glass sheets and the frit.

2. Technical Background

Many electronic or photonic devices that are environmentally sensitive may benefit from the use of glass packages that can be hermetically sealed. Such devices include photovoltaic devices, organic light emitting diode (OLED) displays, OLED lighting panels, plasma displays, surface conduction electron emitter displays (SEDs) and field emission displays (FEDs) to name but a few. For example, the electroluminescent organic materials comprising OLED displays or organic lighting panels are subject to degradation if exposed to moisture or oxygen, and thus must be protected from such exposure. Moreover, the display is expected to have a service lifetime of many tens of thousands of hours. To achieve these goals many OLED displays are sealed using a glass sealing frit disposed between the glass sheets. The individual glass substrate sheets are typically less than about 0.7 mm in thickness, and with a separation between the two sheets of the order of 15-20 µm.

The manufacture of OLED displays requires precise alignment of the various components, for example alignment of the two glass substrates. Dimensional changes in the substrates can be detrimental to the assembly process. For this reason, glass substrates having high strain points and low coefficients of thermal expansion (CTE) are used. To achieve a robust seal between the sheets, a sealing frit is used that has a CTE substantially equal to the CTEs of the substrates. Other devices, on the other hand, can be more tolerant of imperfections, such as OLED lighting panels. As a consequence, lower cost, relatively high CTE glasses are being considered for these applications. It would be advantageous if frits developed for the OLED display industry could be applied to these new applications without significant modification. However, sealing low CTE frits to high CTE substrates poses an enormous challenge.

SUMMARY

The sealing of glass substrates (e.g. plates) with a glass-based frit is described. The frit is irradiated by an irradiation source, such as a laser, to soften the frit and form a hermetic seal between the plates. In some embodiments there is a large difference between the CTEs of the glass substrates and the CTE of the frit. The power of the irradiation source, and hence the irradiating beam, is increased rapidly from a non-sealing power to a sealing power over a short distance to quickly form an initial stabilizing connection between the substrates.

In one embodiment of the present invention a method of forming a glass envelope for an electronic device is described comprising traversing a closed path over a surface of a glass assembly comprising first and second glass plates with a laser beam to heat a frit disposed between the first and second glass plates, the first and second glass plates having a coefficient of thermal expansion that is substantially different than a coefficient of thermal expansion of the frit. The method further comprises:

a) increasing a power of the laser beam from a first power at a location A to a second power at a location B downstream from location A relative to a direction of the traverse;

b) maintaining the laser beam at the second power until the beam passes location A and reaches a location C a predetermined distance past location B relative to the direction of traverse;

c) decreasing a power of the laser beam from point C until the beam reaches a third power at location D, a predetermined distance past C relative to the direction of traverse; and wherein the heating melts the frit and seals the glass assembly to form a glass envelop.

In some embodiments the assembly may be heated, such as by heating the assembly with a hot plate, to minimize stress in the sealed envelope.

In some embodiments the CTE of the frit is between about $30 \times 10^{-7}/°C$ and $40 \times 10^{-7}/°C$.

In some embodiments the CTE of the glass substrates is between about $40 \times 10^{-7}/°C$ and $90 \times 10^{-7}/°C$. In other embodiment the CTE of the glass substrates may exceed $90 \times 10^{-7}/°C$.

The invention will be understood more easily and other objects, characteristics, details and advantages thereof will become more clearly apparent in the course of the following explanatory description, which is given, without in any way implying a limitation, with reference to the attached Figures. It is intended that all such additional systems, methods features and advantages be included within this description, be within the scope of the present invention, and be protected by the accompanying claims.

DETAILED DESCRIPTION

Figure 1:
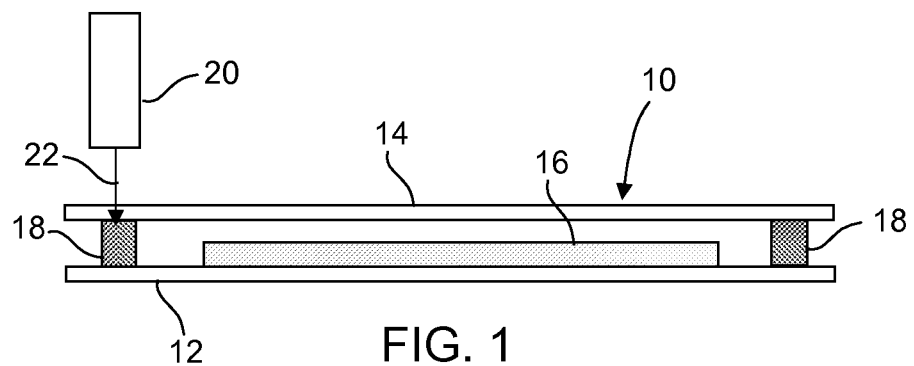
FIG. 1 is a cross sectional side view of a glass assembly being sealed with a laser beam in accordance with embodiments of the present invention.

In the following detailed description, for purposes of explanation and not limitation, example embodiments disclosing specific details are set forth to provide a thorough understanding of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of the present invention. Finally, wherever applicable, like reference numerals refer to like elements.

Display manufacturers receive thin glass sheets from the glass manufacturer and process the sheets to form a display device. For example, in the manufacture of an organic light emitting diode display, one or more layers of organic materials are deposited on a first glass sheet (substrate). This first glass sheet is often termed the backplane. The backplane may also comprise thin film transistors (TFTs) and electrodes for supplying an electric current to the organic layers and causing them to illuminate. However, because the organic materials are sensitive to various environmental factors, such as moisture and oxygen, the organic layers must be hermetically separated from the ambient environment. Thus, the organic layers are often sealed within a glass envelop formed by the backplane, a second glass sheet (plate) or substrate, sometimes referred to as the cover sheet or cover plate, and a sealing material disposed therebetween. The hermetic seal should provide a barrier such that less than about $10^{-3}$ cc/m²/day of oxygen and less than about $10^{-6}$ g/m²/day of moisture can penetrate the seal.

Several sealing methods may be used to connect the backplane to the cover plate, including the use of adhesives. While easy to apply and use, current adhesives lack the necessary hermeticity to ensure the device exhibits a commercially viable lifetime before failure. That is, moisture and/or oxygen may eventually penetrate the adhesive seal, leading to a degradation of the organic layer(s), and the display device.

A more viable approach for providing the requisite hermetic package is to form a frit seal between the backplane and the cover sheet. Illustrated in FIG. 1 is an assembly 10 comprising a backplane substrate 12, a cover substrate 14, and an environmentally sensitive material 16, such as an electroluminescent organic material, positioned between the substrates. A line of glass frit paste 18 is also positioned between the substrates, forming a gap between the substrates sufficient to house environmentally sensitive material 16. Frit 18 may, for example, be deposited over cover plate 14 as a paste in the form of a closed loop or frame, after which the fritted cover plate may be heated in an oven to sinter (sometimes referred to as "pre-sintering") and adhere frit 18 to cover plate 14. Cover plate 14 may then be positioned over backplane substrate 12 with frit 18 (and material 16) positioned between the substrates to form assembly 10. Frit 18 may then be heated by irradiating frit 18 using source 20 that projects a beam of electromagnetic energy 22. The heated frit softens and then cools to form a hermetic seal between the backplane and the cover plate. In some embodiments, source 20 is a laser that emits a beam of substantially coherent light (laser beam 22). However, in other embodiments, a less coherent source of electromagnetic radiation may be used, such as an infrared lamp. The following description will be presented in terms of a laser beam.

While OLED displays may benefit from the hermetic sealing of glass substrates to form a hermetic package, they are but one of many such applications. For example, OLED lighting panels, and organic photovoltaic devices may also benefit from a hermetic package as can be afforded by a frit sealed glass enclosure. For these and other applications that do not require the complex circuitry and tight tolerances needed for display purposes, a broader range of glasses may be used. Thus, less expensive glass, such as the family of borosilicate glasses, becomes a viable option.

One aspect of frit sealing OLED displays that does not change when moving to other, non-display applications, is the need to avoid damaging environmentally sensitive components used the manufacture of these devices. Organic materials for example, such as organic electroluminescent materials, are intolerant of temperatures much in excess of about 125° C. for any appreciable length of time. For this reason, it is desirable to seal the glass envelopes using a precisely aligned laser capable of heating the frit through the overlying substrate to melt the frit and form the seal, without heating the organic material. To that end, specific frit compositions have been developed that are highly absorbing at the wavelength of the lasers used during the sealing process, and capable of providing the robustness necessary for a long-lived device. In addition to their other properties, such frits have been formulated to have a coefficient of thermal expansion that closely matches the CTEs of the encapsulating substrates, as is commonly the practice in frit sealing glass articles.

While it is desirable that new irradiation sealable frit compositions not be needed, the large CTE mismatches between the low CTE display-type frit compositions and high CTE substrates hold the potential for poor sealing characteristics. Most display-type frit compositions suitable for high strain point glasses have CTEs in the low 30s (e.g. $30 \times 10^{-7}/°$ C.), and more generally between about $30 \times 10^{-7}/°$ C. and $40 \times 10^{-7}/°$ C. On the other hand, the substrate glasses being considered for alternative, non-display applications generally have CTEs in excess of $40 \times 10^{-7}/°$ C., more broadly between about $40 \times 10^{-7}/°$ C. and $90 \times 10^{-7}/°$ C., and some borosilicate glasses suitable for such applications comprise CTEs in excess of $90 \times 10^{-7}/°$ C. Alternative glasses may also include soda-lime glasses. It would therefore be useful if a method of sealing such broadly dissimilar CTE materials could be developed.

In accordance with an embodiment of the present invention, a method of sealing a glass package comprising high CTE glass substrates using a low CTE frit is described. By high CTE substrate what is meant generally is a substrate having a CTE greater than about $40 \times 10^{-7}/°$ C. In some embodiments the CTE of the substrate(s) can be equal to or greater than about $50 \times 10^{-7}/°$ C., equal to or greater than about $60 \times 10^{-7}/°$ C., equal to or greater than about $70 \times 10^{-7}/°$ C., equal to or greater than about $80 \times 10^{-7}/°$ C. or, equal to or greater than about $90\times10^{-7}/°$ C. By low CTE frit what is meant generally is a frit having a CTE less than about $40\times10^{-7}/°$ C. In some embodiments, the frit comprises a CTE between about $30\times10^{-7}/°$ C. and $40\times10^{-7}/°$ C. Thus, in some embodiments the difference between the CTE of the frit and a CTE of one or both of the substrates can be in excess of $40\times10^{-7}/°$ C.

Figure 2:
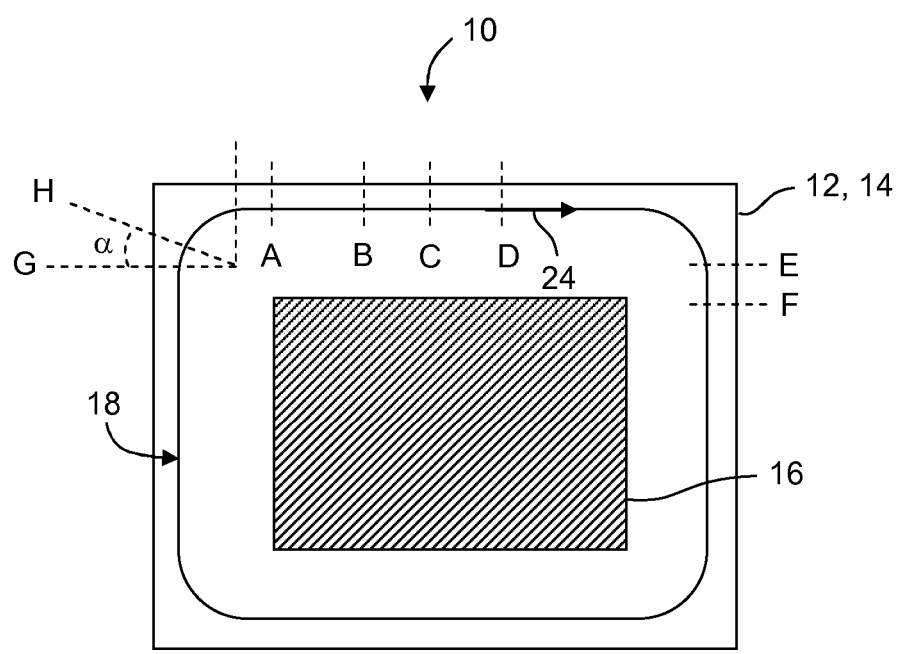
FIG. 2 is a top down view of the glass assembly of FIG. 1 showing points of interest used during the sealing process, such as points along the frit line where the power of the sealing laser is increased or decreased.

Shown in FIG. 2 is a view looking down on assembly 10. Illustrated in FIG. 2 is frit 18 deposited in the shape of a closed wall or loop between substrates 12 and 14. Arrow 24 indicates the movement of a laser beam as it traverses over the frit in an arbitrary direction, in this instance chosen to be clockwise. The laser beam could just as easily traverse in a counterclockwise movement. Also depicted in FIG. 2 are various points of interest designated by alphabetical letters that will be described below.

Figure 3:
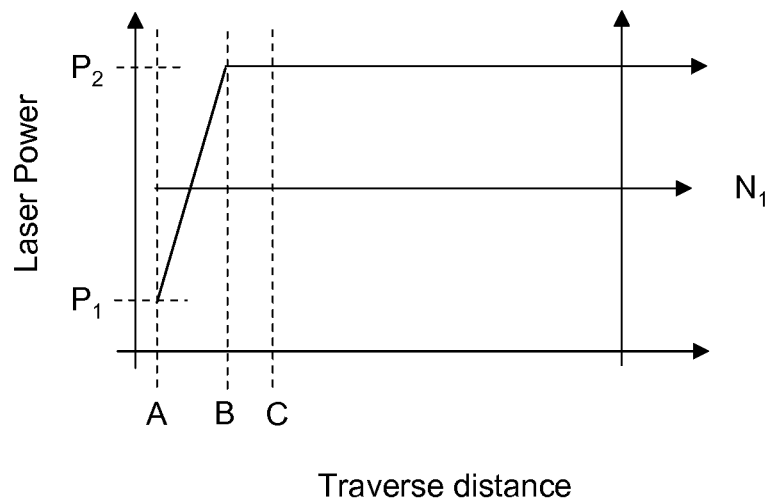
FIG. 3 is a diagram of a portion of a sealing recipe used for a slow, substantially constant traverse speed of an irradiating beam for sealing a glass assembly in accordance with an embodiment of the present invention, and showing power of the laser beam as a function of distance traversed by the beam.
Figure 4:
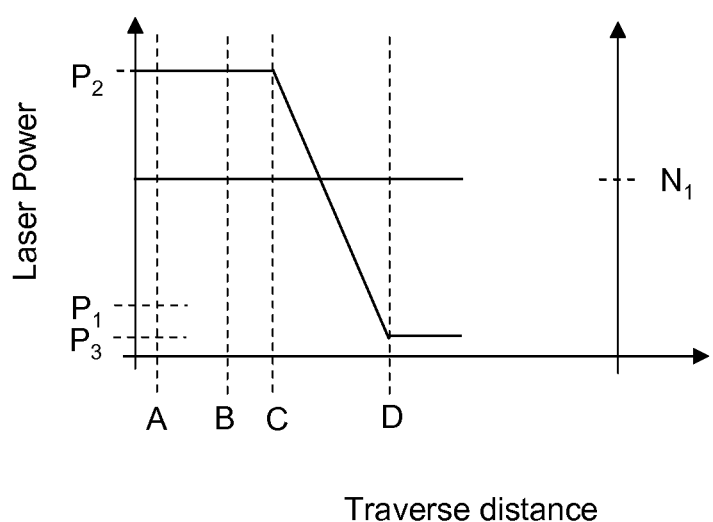
FIG. 4 is a diagram of another portion of the sealing recipe for the slow traverse speed shown in FIG. 3.

According to the present embodiment, and as best understood by viewing FIGS. 3 and 4 along with FIG. 2, tracking of the laser beam begins at point A. Laser beam 22 traverses frit 18 in a clockwise direction at a substantially constant speed $N_1$. Illustratively, the substantially constant speed could be a relatively slow speed, preferably equal to or less than about 5 mm/s, preferably equal to or less than about 3 mm/s. Looking at FIG. 3, as beam 22 traverses frit 18, the power of the laser beam increases from a first power $P_1$ at point A until it reaches a second power $P_2$ greater than $P_1$ at point B. That is, the power of beam 22 ramps up from $P_1$ to $P_2$ between point A and point B. Turning now to FIG. 4, which illustrates the beam as it nears completion of a full circuit around the frit pattern, beam 22 continues about the perimeter of assembly 10 until it passes points A and B and arrives at point C. At point C the laser power is decreased, or ramped down to a third power $P_3$ less than $P_2$ at point D. After point D the sealing process is considered completed and laser beam 22 may be extinguished. Thus, the laser beam begins at point A and makes a complete circuit of the frit loop, passing A once. During the circuit, laser beam 22 begins at power $P_1$ at point A, increases to second power $P_2$ and remains substantially stable in power until the beam makes a full circuit to pass points A and B, and reach point C, after which the power decreases to reach third power $P_3$ less than $P_2$ at point D. Preferably, the ramping up or down in power occurs at a substantially constant rate. However, the decrease in power need not be constant. For example, the power of laser beam 22 could be increased or decreased in a step-wise fashion. Moreover, the ramp up rate (e.g. between points A and B in FIG. 3) need not be equal to the ramp down rate (e.g. between points C and D in FIG. 4). In some embodiments, the third power $P_3$ may be equal to the first power $P_1$. Alternatively, $P_3$ may be greater than or less than $P_1$. However, $P_1$ and $P_3$ in this embodiment represent the beginning power and the ending power, respectively, which powers are not sufficient to cause sealing.

Preferably, frit 18 traversed by laser beam 22 is substantially in the form of a polygon. By substantially a polygon what is meant is a pattern comprised of multiple straight sides joined by rounded corners. The rounded corners facilitate both deposition of the frit and traverse of the laser beam. For example, a typical radius of curvature of the corners is 1 mm. However, smaller or larger radii could be employed depending on the size of the device being manufactured and the operational characteristics of the sealing equipment. As used hereinafter, the term polygon will be used to allow an interpretation of a polygon having straight sides joined by rounded corners and a polygon comprising sharp corners formed by the intersection of two straight lines. For example, frit 18 may be patterned as a rectangle having four straight sides joined by rounded corners, or a rectangle having four sides, each side orthogonal to an adjacent side, and having four sharp corners. Preferably, points A, B, C lie along a single side of the polygon. In some embodiments all four points A, B, C and D lie along one side of the polygon.

In certain other embodiments it has been found that reduced stress in the sealed envelop can be obtained by heating assembly 10 prior to, and preferably during, the sealing process such that the assembly is at an elevated temperature during sealing.

There are two dominant stresses during the laser sealing process: a) coefficient of thermal expansion mismatch-induced residual stress caused by a bi-material system during a certain temperature cycle, and b) transient thermal stress induced by the laser sealing process due to localized heating and heat conduction.

Residual stress-induced cracking is a challenging problem during the laser frit sealing process, as both the pre-sintering and subsequent laser sealing may introduce residual stress. During the pre-sintering step, CTE-matched glass and frit are preferred. However, during laser sealing a low CTE frit relative to the glass substrate(s) is preferred because the substrate glass is transparent to the laser and expansion is negligible. The residual stress that is built up from the pre-sintering step can be released completely during the laser sealing step and before the second residual stress builds up because the laser induced temperature is above the strain point of frit. In other words, delamination of the frit from the glass substrate may occur as a result of residual stress during the laser sealing process.

Typically, the CTE of the substrate glass is assumed to be zero, or at least insignificant, so any apparent CTE mismatch-induced residual stress is induced solely by the frit. On the one hand, if the CTE of the substrate glass and the frit are matched, the residual stress generated during pre-sintering will be zero, but residual stress generated during the laser sealing could be large.

On the other hand, if the CTE of the frit is negligible, the residual stress generated during laser sealing will be negligible, but the residual stress generated during pre-sintering could be large. The most efficient approach is to reach a condition where a temperature during the sealing process is the same as the glass transition temperature of the substrate.

A practical laser sealing process is controlled by local thermal expansion. Cracks form most severely at the starting point of the laser, since the bonding strength is typically lower at the start-up point during ramp up of the laser power. Nevertheless, the stress release process will still affect the subsequent laser sealing process, since the thermal shock/gradient could contribute to the crack initiation. Such a thermal gradient can be affected by ambient temperature. Thus, an elevated ambient temperature during the sealing process can help to avoid this failure as well.

The transient thermal stress effect on the laser sealing process has been modeled, demonstrating that increasing ambient temperature during the sealing process could help reduce the transient stress, and allow a reduced laser power to achieve the same level of temperature for diffusion bonding. The modeling first assumed that perfect laser energy absorption took place in the frit, so that 100% of the applied surface heat flux was absorbed without any wasteful heat dissipation. At the same time, perfect heat conduction between the frit and both glass substrate interfaces was also assumed. No other energy dissipation at the interfaces was included, nor was there any initial sintering-induced residual stress contemplated because this stress typically is released during the laser sealing process. Even though in a practical sealing process the frit to glass bond occurs after the laser moves, it was assumed for modeling purposes that a perfect frit-to-glass bond occurred even before the surface flux is applied to avoid complex contact problems during the finite element analysis. Also, a straight line seal only was analyzed. Non-linear temperature dependent material properties were not included in the simulation other than the CTE of frit. Finally, no external load was added in the simulated configuration, and the frit and glass substrate materials were treated as homogenous, isotropic and elastic. Perfect glass edges were assumed, so no edge quality problems existed in the numerical model.

The surface to air heat exchange when heat is conducted from the substrate glass surface to the air was included, as well as the numerical treatment method for handling the glass set point by dropping the elastic modulus to a very low value whenever the resulting temperature rose above the set point of the substrate glass and the frit.

Figure 13:
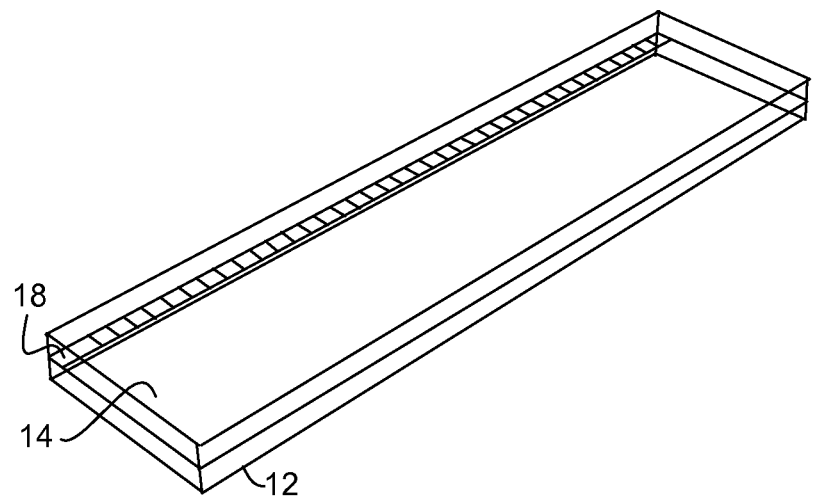
FIG. 13 is a transparent perspective view of top and bottom (cover and backplane) substrates used for modeling the impact of temperature on laser sealing of the substrates with a frit.

FIG. 13 illustrates the basic model employed. A 15 micron thick and 1 mm width line of frit 18 was chosen to be representative of actual frit geometry. Due to the symmetric condition, only half of the real sealed region was modeled. Thus, a 0.5 mm width frit is shown. The thickness, width and length of the top and bottom glass substrates were 0.63 mm, 5 mm and 20 mm respectively. The top surface of the frit was partitioned into multiple 0.5 mm×0.5 mm square regions. The surface heat flux was applied to one of the partitioned areas, and moved from one end to another along the frit. The glass was assumed to be an alumino-borosilicate glass (e.g. Corning EagleXG™).

A symmetric boundary condition was applied to the cross-sectional surfaces along the frit. Infinite boundary conditions were applied to both end surfaces of the glass bar to mimic the infinitely long glass substrates, and to avoid edge effects. In addition, tie constraints were applied between all contacted surfaces to mimic the perfect bond. The equation to calculate the surface heat flux is provided below:

$$q(r) = \frac{3Q}{\pi \bar{r}^2} \exp\left[-3\left(\frac{r}{\bar{r}}\right)^2\right]$$

This equation was used to calculate the surface heat flux necessary for input in numerical calculations. These come from known laser processing parameters, such as laser power and laser diameter. After the peak heat flux was obtained, a factor of 2 was introduced to account for the idealized assumption of uniform distribution heat loading that was needed to replace the actual Gaussian distribution. Because of the symmetric conditions, another factor of 2 was introduced to further reduce the heat flux number used as input.

The material properties are shown below in Table 1. Other than CTE values for the frit, all other material property values are non-temperature dependent. Thus, temperature dependence was not represented in the numerical modeling results. The transient thermal stress analysis included two steps: transient thermal analysis and stress analysis. The transient thermal analysis was performed first to determine the temperature field results necessary for stress analysis. In the thermal transfer analysis, boundary conditions were not required since load and deformation have not occurred. However, boundary conditions and constraints are necessary for stress analysis, since stress results will depend on these conditions. Also, the time points for thermal analysis and stress analysis need to be synchronized for transient analysis. In addition, a compatible mesh is used in the simulation.

The modeling results showed that thermal stress is controlled not only by CTE value and elastic modulus, but also by the temperature gradient between the strain point and the ambient temperature. Modifying the CTE value and the elastic modulus can be difficult, as is reducing the strain point of the substrate glass and the frit. Thus, the most efficient way to reduce stress induced during the sealing process is by decreasing the temperature gradient by increasing the average temperature of the assembly to reduce the stress.

Stress analysis results were generated for three sets of laser sealing conditions: 2 mm/s traverse at 10 W, 10 mm/s traverse at 20 W and 20 mm/s traverse at 30 W, where the traverse refers to the traverse of the laser beam over the frit. The laser beam was fixed at a spot size of 1 mm diameter. The stress results for all three cases are given in Table 1.

As can be seen from Table 1, the induced peak temperatures at the laser beam emission point are approximately 620° C. to 640° C. for the 2 mm/s traverse case, approximately 680° C. to 730° C. for the 10 mm/s traverse case and approximately 620° C. to 820° C. for the 20 mm/s traverse case. There was an approximately 10% increase in temperature from case to case when the laser speed increased from one case to another. When the laser is stationary at one location, the resident time decreases from 0.1 s/mm to 0.05 s/mm. Assuming the same quality bond is obtained from all three cases, it is apparent that a good combination of temperature and residence time is necessary to obtain the same diffusion bonding results: a good bond needs the same level of diffusion depth of certain elements. Therefore, higher average assembly temperatures are needed to facilitate the diffusion process when increasing the laser traverse speed.

Additionally, the peak maximum principal stress values induced by the three laser sealing conditions increased as the laser traverse speed increased from a lower speed to a higher speed. The maximum principal stress can be used to qualitatively predict potential glass failure, with a higher principal stress implying greater probability of failure.

If the strain point softening effect for a seal between two substrates of a typical display glass (e.g. Corning Incorporated Eagle XG™) is not taken into account:
the stress in the bottom glass substrate increases from 20 MPa to 26 MPa to 29 MPa
the stress in the top glass substrate increases from 21 MPa to 27 MPa to 30 MPa
the stress in the frit increases from 47 MPa to 73 to 93 MPa as the laser traverse speed is increased from 2 mm/s (10 W) to 10 mm/s (20 W) to 20 mm/s at a laser beam power of 30 W.

If we do take into account the strain point softening effect, then:
the stress in the bottom glass substrate increased from 19, 22 to 23 MPa,
the stress in the top glass substrate increased from 20, 24 to 25 MPa
the stress in frit increased from 33, 51 to 64 MPa
when laser traverse speed is increased from 2 mm/s (10 W), 10 mm/s (20 W) to 20 mm/s, again at a laser beam power of 30 W.

For the case of a seal between two soda-lime substrates, and when the strain point softening effect is accounted for:
the stress in bottom glass substrate increased from 51, 59 to 60 MPa
the stress in top glass substrate increased from 54, 62 to 64 MPa
the stress in frit increased from 91, 127 to 159 MPa
when the laser speed is increased from 2 mm/s (10 W), 10 mm/s (20 W) to 20 mm/s at a laser beam power of 30 W.

When comparing the sealing between substrates of a typical alumino-borosilicate (e.g. Corning Eagle XG™) display glass to a seal between substrates formed from soda-lime glass, it can be seen that the resultant transient thermal peak stress level increases approximately three times, since soda-lime glass has a CTE approximately three times higher than the CTE of the typical display glass. Such stress increases can lead to difficulty in sealing the soda-lime glass, since the strength of the glass is still maintained at the same level as the strength of the typical display glass. Lowering the transient thermal stress can facilitate the sealing of high CTE glass substrates.

An additional simulation was conducted to illustrate the effectiveness of reducing the transient thermal stress by increasing the temperature of the assembly. Because the OLED device adjacent to the frit line has a low temperature tolerance, an ambient (e.g. assembly) temperature of 85° C. was used. Moreover, only one laser traverse speed (20 mm/s) and power setting (30 W) were considered.

When compared to a similar case under room temperature, only 28 w is needed for a 20 mm/s laser speed seal, as opposed to 30 w at the same temperature 750° C.-800° C. is needed for the same bond quality. Accordingly, the transient thermal stress dropped:
  from 60 MPa to 52 MPa in the bottom glass substrate
  from 159 MPa to 138 MPa in frit
  from 64 MPa to 56 MPa in the top glass substrate
As can be seen, an ambient temperature increase of approximately 12% reduced the stress also by approximately 12%.

point E. At point E the laser beam increases to a second speed $N_2$ greater than the first speed, and a third power $P_3$ greater than $P_2$ at point F. The increase in speed facilitates a greater beam power. Conversely, the greater the beam power, the greater the speed must be to prevent overheating of the frit. Beam 22 maintains third power $P_3$ at the second speed $N_2$ as it traverses the reminder of the frit until it reaches point G, where the laser beam decreases in power and speed to $P_2$ and $N_1$ at point H, moves through point A and B to point C, and at point C decreases in power to $P_4$ at point D. Thus, the beam overlaps the distance between points B and C while still at a sealing power (i.e. greater than $P_1$). Preferably, $P_4$ is equal to $P_1$. However, $P_4$ may be greater than or less than $P_1$ as needed. $P_1$ and $P_4$ in this embodiment represent the beginning power and the ending power, respectively, which powers are not sufficient to cause sealing.

Figure 7:
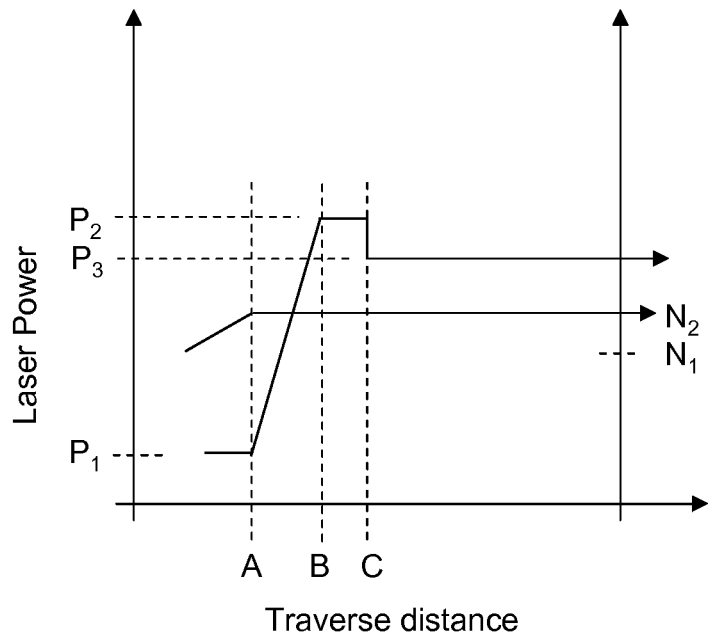
FIG. 7 is a diagram of a portion of a sealing recipe for a fast traverse of an irradiating beam for sealing a glass assembly in accordance with an embodiment of the present invention, and showing power of the laser beam as a function of distance traversed by the beam.
Figure 8:
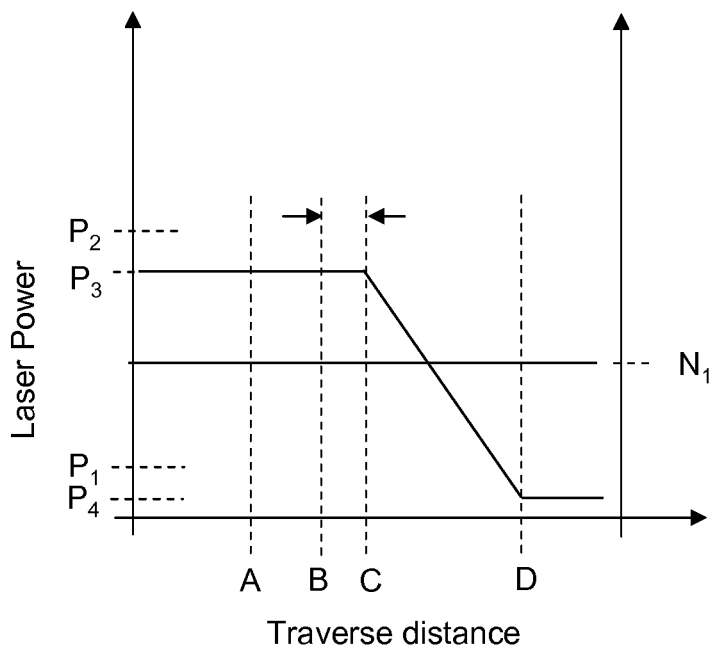
FIG. 8 is a diagram of another portion of the sealing recipe of FIG. 7.

In still another embodiment best illustrated with the aid of FIGS. 2, 7 and 8, the traverse speed of laser beam 22 is again maintained substantially constant, as in an earlier embodiment, but at a significantly greater speed. For example, the present embodiment may be used when traverse speed is on the order of 20 mm/s. In accordance with the present embodiment, a laser beam is incident on and irradiates the frit disposed between substrates 12 and 14 at a first power $P_1$ and a first speed $N_1$ at some position before point A. As beam 22 traverses the frit in an arbitrary clockwise direction at speed

TABLE 1

| 1 mm laser beam radius | q ($10^7$ J/m2/s) | Peak temp. (° C.) | Resident time (s/mm) | Peak maximum principal stress (MPa) Eagle/Eagle | Peak maximum principal stress (Tg softening considered) (MPa) Eagle/Eagle | Sodalime/Sodalime | |
|---|---|---|---|---|---|---|---|
| 2 mm/s 10 w | 0.2387 | 622 (bottom) 640 (frit) 642 (top) | 0.5 | 20 47 21 | 19 33 20 | 51 91 54 | The below are the results for increased ambient |
| 10 mm/s 20 w | 0.4775 | 683 (9.8%) 721 (12.6%) 722 | 0.1 | 26 73 27 | 22 51 24 | 59 127 62 | temperature up to 85° C. with lower necessary laser power |
| 20 mm/s 30 w | 0.668 | 756 (10%) 810 (12.3%) 814 | 0.05 | 29 93 30 | 23 64 25 | 60 159 64 | 52 138 56 |

Preferably the average temperature of the assembly is high enough to avoid excess stress, but not so high as to degrade the performance of any temperature sensitive materials within the assembly, such as an organic electroluminescent material. Many electroluminescent materials degrade at temperatures above about 125° C. Therefore it is desirable not to exceed an average temperature greater than about 125° C., and to incur a maximum average temperature preferably between 65° C. and 125° C. In some embodiments it is desirable to maintain the assembly average temperature between about 65° C. and about 85° C. Assembly 10 may be heated, for example, by placing the assembly on a heated support (e.g. a hotplate) and allowing the temperature of the assembly to equilibrate before performing the sealing process.

Figure 5:
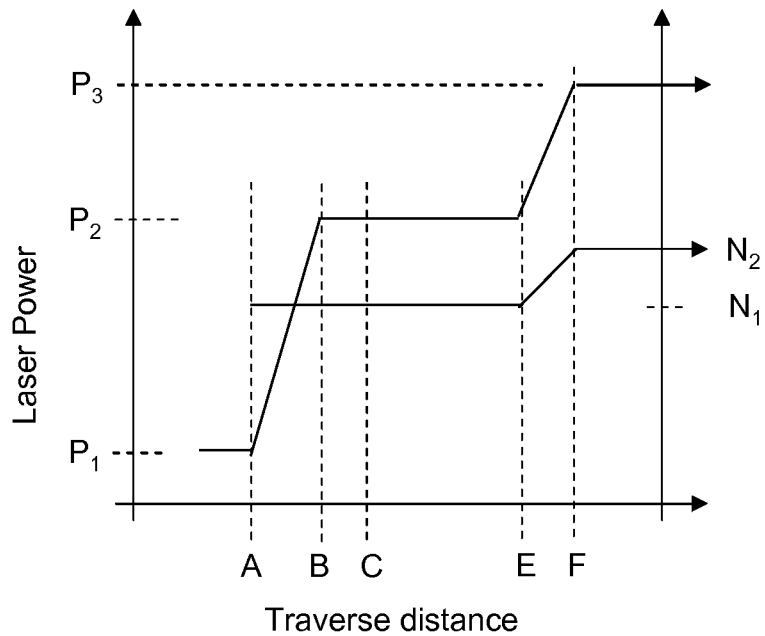
FIG. 5 is a diagram of a portion of a sealing recipe for an irradiating beam traverse speed for sealing a glass assembly that varies during the sealing process, and showing power of the laser beam as a function of distance traversed by the beam.
Figure 6:
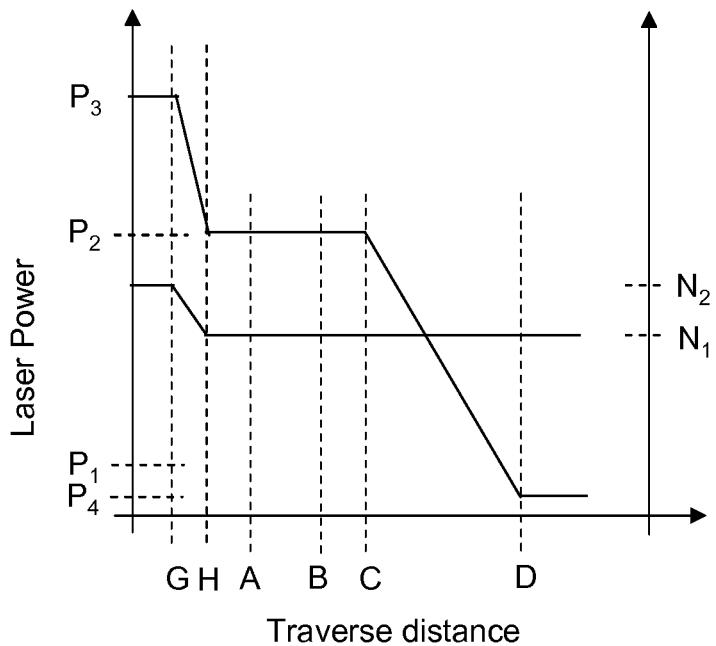
FIG. 6 is a diagram of another portion of the sealing recipe of FIG. 5.

In another embodiment best illustrated in FIGS. 2, 5 and 6, frit 18 is traversed by laser beam 22 at a non-constant speed. Turning to FIGS. 2 and 5, according to the present embodiment the sealing begins at point A at a first power $P_1$ and a first speed $N_1$. As beam 22 traverses between point A and point B, the laser beam increases in power from $P_1$ until it reaches a second power $P_2$ greater than $P_1$ at point B. Beam 22 maintains the first speed $N_1$ and second power $P_2$ until it arrives at $N_1$, the speed of the laser beam is increased from $N_1$ to $N_2$. Once the beam has reached $N_2$, the power of the laser beam is increased to a second power $P_2$ greater than $P_1$ between points A and B. The beam then continues along the frit path at $N_2$ to point C, where the laser power is decreased to a third power $P_3$ greater than $P_1$ but less than $P_2$. The beam then continues to traverse along the frit path at power $P_3$, making a complete circuit of the frit pattern, and passing point A once, until it reaches point C. At point C the power of the laser beam is reduced to fourth power $P_4$. Preferably, $P_4$ is equal to $P_1$. However, $P_4$ may be greater than or less than $P_1$ as needed. However, $P_1$ and $P_4$ in this embodiment represent the beginning power and the ending power, respectively, which powers are not sufficient to cause sealing. When the laser power has reached $P_4$, the sealing process is considered complete. In the present embodiment, the overlap of the beam traverse is done at two different sealing powers. That is, the first traverse from point B to point C is done at power $P_2$, whereas the second traverse from point B to C is done at power $P_3$. Preferably, points A, B and C lie on the same side of the frit polygon.

EXAMPLES

In one experiment, a glass assembly comprising first and second substrates and a glass frit were sealed with a laser in accordance with an embodiment of the invention. The glass substrates were identical sheets of borosilicate glass having an thickness of approximately 0.7 mm and a CTE of about $89 \times 10^{-7}/°$ C. The frit was disposed between the substrates in a rectangular pattern with corners of the pattern possessing an approximately 1 mm radius of curvature. The frit comprised a vanadium-phosphate glass and a B-eucryptite filler material, and had a CTE of about $35 \times 10^{-7}/°$ C. A diode laser operating at 810 nm was used to successfully perform the sealing. The laser operated at a constant speed of about 2 mm/s. The laser produced a Gaussian beam having a $1/e^2$ width of 1.8 mm. Referring to FIGS. 2, 3 and 4 the laser began traversing the frit at a first power $P_1$ of 0.5 watts and increased to a maximum power $P_2$ of 9.5 watts at point B. The power increase, or ramp, was performed at a rate of about 3 watts/mm of travel. From point B, the laser beam was traversed over the frit in a clockwise direction through a full circuit, passing point A and overlapping the frit pattern for a distance of approximately 1 mm until reaching point C. Beginning at point C, the laser power was ramped down at a rate of approximately 2.5 watts/mm until the power reached 0.5 watts. The overlap consisted of a 1 mm distance between points B and C at a power of about 9.5 watts. The sealed package was subjected to a thermal shock test comprising 10 temperature cycles between –40° C. and 80° C., with a 30 min hold time at each temperature extreme. The seal was inspected with the assistance of a microscope to ensure good contact between the frit and the glass substrates along the entire length of the frit. The seal did not crack or separate.

In another example, a glass assembly comprising first and second substrates and a glass frit were sealed with a laser. As before, the glass substrates were identical sheets of borosilicate glass having a thickness of approximately 0.7 mm and a CTE of about $89 \times 10^{-7}/°$ C. The frit was disposed between the substrates in a rectangular pattern with corners of the pattern possessing an approximately 1 mm radius of curvature. The frit comprised a vanadium-phosphate glass and a B-eucryptite filler material, and had a CTE of about $35 \times 10^{-7}/°$ C. A diode laser operating at 810 nm was used to successfully perform the sealing. The laser produced a Gaussian beam having a $1/e^2$ width of 1.8 mm. The laser traverse was begun from point A at a first speed $N_1$ of about 2 mm/s and at a first power $P_1$ of 0.5 watts, and then ramped to a second power $P_2$ of about 9.5 watts at a rate of about 3 watts/mm of travel. From point C the traverse was continued at a speed of 2 mm/s and a power of 9.5 watts until the beam reached point E. From point E the beam traverse speed was increased from the first speed $N_1$ of about 2 mm/s to a second speed $N_2$ of about 20 mm/s, and the beam power was increased from about 9.5 watts to a third power $P_3$ of about 27 watts at a rate of about 17.5 watts/mm of travel. When the beam reached point G, the beam power was decreased to the second power $P_2$ of 9.5 watts over an angular distance α of about 10° to point H. The speed was similarly reduced to the first speed $N_1$ of about 2 mm/s. The beam continued its traverse past point A to point C, and at point C the power was reduced to the first power $P_1$ of about 0.5 watts and the sealing was completed. The overlap consisted of a 1 mm distance between points B and C at a power of about 9.5 watts. The sealed package was subjected to a thermal shock test comprising 10 temperature cycles between –40° C. and 80° C., with a 30 min hold time at each temperature extreme. The seal was inspected with the assistance of a microscope to ensure good contact between the frit and the glass substrates along the entire length of the frit. The seal did not crack or separate.

Figure 9:
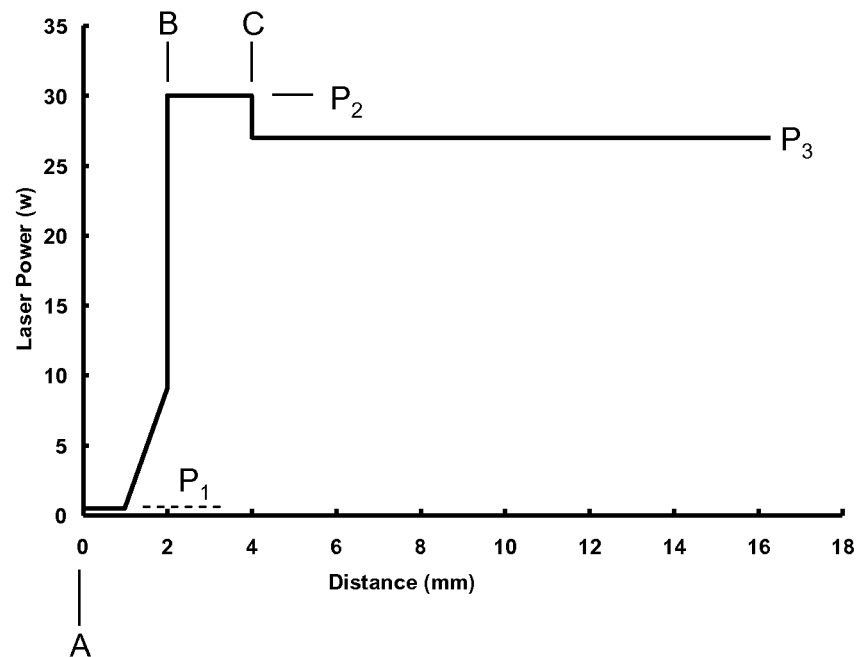
FIG. 9 is a diagram of a portion of a sealing recipe used to demonstrate a sealing process in accordance with an embodiment of the present invention, and showing power of the laser beam as a function of distance traversed by the beam.
Figure 10:
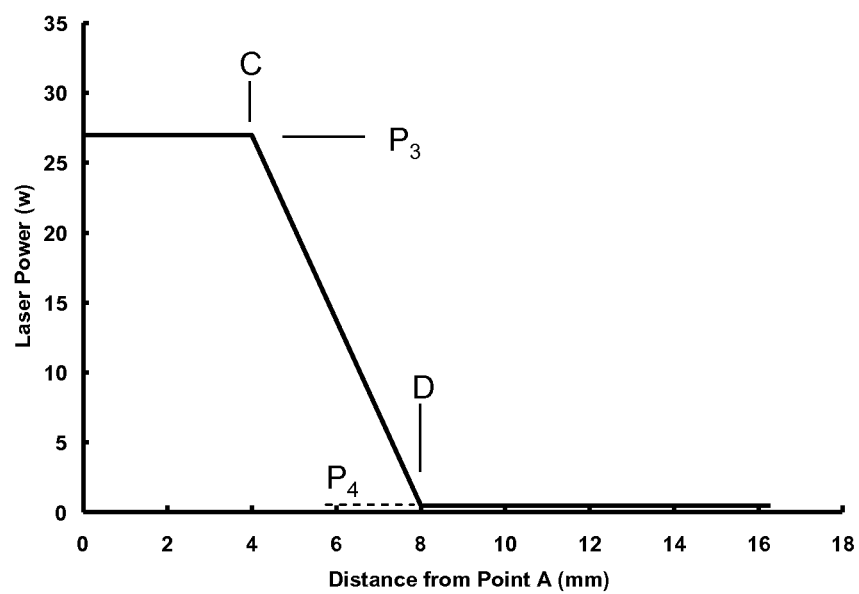
FIG. 10 is a diagram of another portion of the sealing recipe of FIG. 9.
Figure 11:
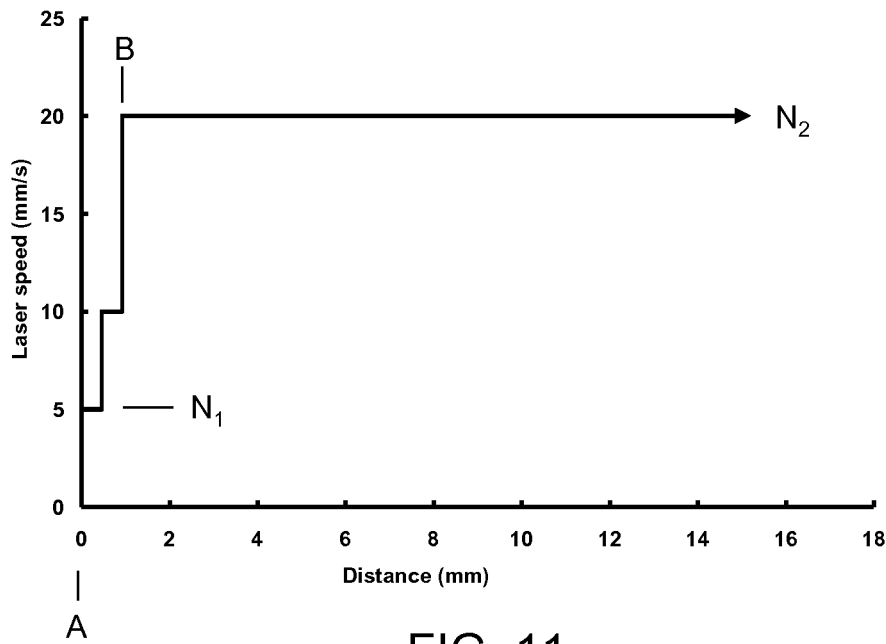
FIG. 11 is a diagram of a portion of the sealing recipe used in the demonstration of FIG. 9, and showing the speed of the laser beam as a function of distance traversed by the beam.
Figure 12:
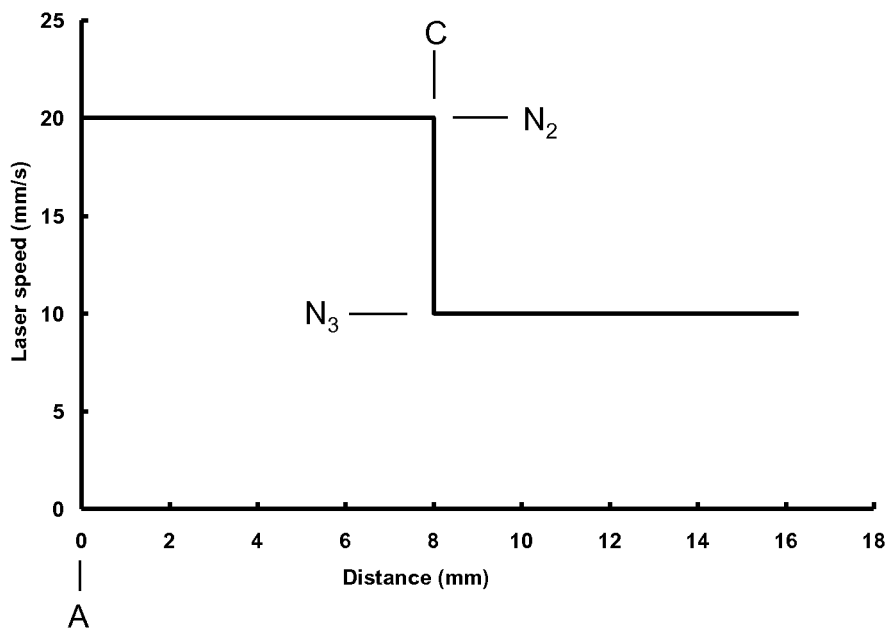
FIG. 12 is a diagram of another portion of the sealing recipe of FIG. 1.

In still another example, a glass assembly comprising first and second substrates and a glass frit were sealed with a laser. As before, the glass substrates were identical sheets of borosilicate glass having a thickness of approximately 0.7 mm and a CTE of about $89 \times 10^{-7}/°$ C. The frit was disposed between the substrates in a rectangular pattern with corners of the pattern possessing an approximately 1 mm radius of curvature. The frit comprised a vanadium-phosphate glass and a B-eucryptite filler material, and had a CTE of about $35 \times 10^{-7}/°$ C. A diode laser operating at 810 nm was used to successfully perform the sealing. The laser produced a Gaussian beam having a $1/e^2$ width of 1.8 mm. Referring to FIGS. 9 and 10, the laser traverse was begun from point A at a first speed $N_1$ of about 20 mm/s and at a first power $P_1$ of 0.5 watts, and then ramped in a pseudo-stepwise fashion to a second power $P_2$ of about 30 watts at a rate of about 3 watts/mm of travel. Due to inertia and certain equipment limitations, the speed was not instantaneously 20 mm/s right at point A, but was ramped in a stepwise fashion from about 5 mm/s to 20 mm/s over a distance of about 1 mm (see FIG. 11). From point B the traverse was continued at the speed of 20 mm/s and a power of 30 watts to point C, or about 2 mm. At point C the power of the laser beam was reduced to about 27 watts, where the power remained during the majority of the rest of the circuit around the frit loop. Turning now to FIG. 10, once the beam had completed a full circuit to point A, the beam continued to traverse the frit until reaching point C, at which time the beam power was ramped down to approximately 0.5 watts and the sealing completed. Simultaneously, as shown in FIG. 12, the traverse speed was reduced to 10 mm/s. The sealed package was subjected to a thermal shock test comprising 10 temperature cycles between –40° C. and 80° C., with a 30 min hold time at each temperature extreme. The seal was inspected with the assistance of a microscope to ensure good contact between the frit and the glass substrates along the entire length of the frit. The seal did not crack or separate.

It should be emphasized that the above-described embodiments of the present invention, particularly any "preferred" embodiments, are merely possible examples of implementations, merely set forth for a clear understanding of the principles of the invention. Many variations and modifications may be made to the above-described embodiments of the invention without departing substantially from the spirit and principles of the invention. For example, although the example embodiments illustrated herein are shown in a vertical configuration, the present invention can be equally effective in a horizontal orientation. All such modifications and variations are intended to be included herein within the scope of this disclosure and the present invention and protected by the following claims.

What is claimed is:

1. A method of forming a glass envelope for an electronic or optoelectronic device comprising:
   traversing a closed path over a surface of a glass assembly comprising first and second glass plates with a laser beam to heat a frit disposed between the first and second glass plates during a sealing process, the first and second glass plates having a coefficient of thermal expansion equal to or greater than about $50 \times 10^{-7}/°$ C. and the frit having a coefficient of thermal expansion equal to or less than about $40 \times 10^{-7}/°$ C., wherein traversing the closed path comprises the steps of:
   a) increasing a power of the laser beam from a first power at a location A to a second power at a location B downstream from location A relative to a direction of the traverse about the closed path;

b) maintaining the laser beam at the second power while the laser beam completes traversing the closed path to location A;

c) maintaining the laser beam at the second power while the laser beam continues to traverse downstream from locations A and B to a location C that is downstream from location B relative to the direction of traverse; and then d) decreasing a power of the laser beam from location C until the beam reaches a third power at location D, a predetermined distance downstream from location C relative to the direction of traverse, wherein the heating melts the frit and seals the glass assembly to form a glass envelope and an average temperature of the assembly is elevated above the ambient temperature during the sealing process, wherein the elevated average temperature is caused by a heat source other than the laser beam, and wherein the elevated assembly temperature is between about 65° C. and 85° C.

2. The method according to claim 1, wherein the closed path forms a polygon, and locations A, B, C lie on a first side of the polygon.

3. The method according to claim 2, wherein a speed of the laser beam is lower during a time the beam is traversing the first side of the polygon than when traversing other sides of the polygon.

4. The method according to claim 1, wherein a speed of the laser beam is substantially constant during the traversing.

5. The method according to claim 1, wherein the CTEs of the first and second glass plates are between about $70 \times 10^{-7}$/° C. and $90 \times 10^{-7}$/° C.

6. The method according to claim 1, wherein a speed of the laser beam varies during the traversing.

7. The method according to claim 1, further comprising positioning an environmentally sensitive material between the first and second substrates.

8. The method according to claim 7, wherein the environmentally sensitive material is an organic material.

9. The method according to claim 1, wherein the electronic or optoelectronic device is an OLED device or a photovoltaic device.

10. The method according to claim 9 wherein the electronic or optoelectronic device is a lighting panel.

11. The method according to claim 1, wherein the difference between the coefficient of thermal expansion of the frit and the coefficient of thermal expansion of the first and second glass plates is equal to or greater than about $40 \times 10^{-7}$/° C.

12. A method of forming a glass envelope for an electronic or optoelectronic device comprising:

providing a glass assembly comprising first and second glass plates and a frit disposed between the plates to form a gap between the plates, a difference between a coefficient of thermal expansion of the first or second glass plate and a coefficient of thermal expansion of the frit being equal to or greater than about $40 \times 10^{-7}$/° C.;

positioning an environmentally sensitive material within the gap;

traversing a closed path over a surface of the glass assembly with a laser beam to heat the frit during a sealing process, wherein traversing the closed path comprises the steps of:

a) increasing a power of the laser beam from a non-sealing power to a sealing power over a distance of between about 1 mm and 2 mm as the laser beam begins to traverse the closed path;

b) maintaining the laser beam at the sealing power as the laser beam completes traversing the closed path;

c) continuing to traverse the laser beam to overlap a sealed portion of the frit while the laser beam is at the sealing power; and then d) decreasing the laser beam from a sealing power to a non-sealing power after overlapping the sealed portion, wherein an average temperature of the assembly is elevated above the ambient temperature during the sealing process, wherein the elevated average temperature is caused by a heat source other than the laser beam, and wherein the elevated assembly temperature is between about 65° C. and 85° C.

13. The method according to claim 12, wherein the environmentally sensitive material is an organic material.

14. The method according to claim 12, wherein the electronic or optoelectronic device is an OLED device or a photovoltaic device.

15. The method according to claim 12 wherein the overlap is between about 1 mm and 2 mm.

16. The method according to claim 12, wherein the CTEs of the first and second glass plates are between about $70 \times 10^{-7}$/° C. and $90 \times 10^{-7}$/° C.

* * * * *